(12) United States Patent
Perera et al.

(10) Patent No.: US 7,253,432 B2
(45) Date of Patent: Aug. 7, 2007

(54) HETEROJUNCTION FAR INFRARED PHOTODETECTOR

(75) Inventors: A.G. Unil Perera, Mableton, GA (US); Steven George Matsik, Chamblee, GA (US)

(73) Assignee: Georgia State University Research Foundation, Inc., Atlanta, GA (US)

( * ) Notice: Subject to any disclaimer, the term of this patent is extended or adjusted under 35 U.S.C. 154(b) by 208 days.

(21) Appl. No.: 10/492,372

(22) PCT Filed: Oct. 16, 2001

(86) PCT No.: PCT/US01/32403

§ 371 (c)(1),
(2), (4) Date: Apr. 12, 2004

(87) PCT Pub. No.: WO02/33757

PCT Pub. Date: Apr. 25, 2002

(65) Prior Publication Data

US 2005/0258415 A1    Nov. 24, 2005

Related U.S. Application Data

(60) Provisional application No. 60/240,581, filed on Oct. 16, 2000.

(51) Int. Cl.
*H01L 29/06* (2006.01)

(52) U.S. Cl. .................... 257/21; 257/184; 257/439; 257/E31.021

(58) Field of Classification Search ................. 257/21, 257/184, 186, 189, 439, 450, E31.014, E31.017, 257/E31.064, E31.021, E31.033
See application file for complete search history.

(56) References Cited

U.S. PATENT DOCUMENTS

| 5,063,419 | A | | 11/1991 | Glaser et al. | |
|---|---|---|---|---|---|
| 5,296,720 | A | * | 3/1994 | Wen et al. | 257/21 |
| 5,510,627 | A | | 4/1996 | Snow | |
| 5,528,051 | A | * | 6/1996 | Nuyen | 257/17 |
| 5,563,423 | A | * | 10/1996 | Wu et al. | 257/21 |
| 6,674,091 | B2 | * | 1/2004 | Gunapala et al. | 257/21 |
| 2005/0205857 | A1 | * | 9/2005 | Sundaram et al. | 257/14 |

* cited by examiner

*Primary Examiner*—Minh-Loan Tran
(74) *Attorney, Agent, or Firm*—Needle & Rosenberg, P.C.

(57) ABSTRACT

A photodetector and method of detecting far infrared optical signals. In one embodiment of the present invention, the photodetector has a plurality of N barriers, N being an integer greater than 1, each barrier being a layer of a material made from a first and a second group III elements and a first group V element and characterized by a bandgap. The photodetector further has a plurality of N−1 emitters, each emitter being a layer of material made from a third group III element and a second group V element and characterized by a bandgap different from that of the barriers and having at least one free carrier responsive to optical signals, wherein each emitter is located between two barriers so as to form a heterojunction at each interface between an emitter and a barrier. Moreover, each emitter is doped with a first group II, IV or VI element to cause free carriers in the emitter, wherein at least one construction parameter of each emitter causes at least one free carrier to occupy a range of substantially continuously distributed energies characterized by a three dimensional Fermi level and respond to optical signals having wavelength in the range of 3 to 100 μm with significant absorption.

56 Claims, 7 Drawing Sheets

HETEROJUNCTION FAR INFRARED PHOTODETECTOR

CROSS-REFERENCE TO RELATED PATENT APPLICATION

This application claims the benefit, pursuant to 35 U.S.C. §119(e), of the provisional U.S. Patent Application Ser. No. 60/240,581 filed Oct. 16, 2000, entitled "Heterojunction Far Infrared Photodetector," which application is hereby incorporated by reference in its entirety.

The invention was made with government support under ECS 98-09746 awarded by the National Science Foundation and NAG5 4950 awarded by the National Aeronautics and Space Administration. The government has certain rights in the invention.

BACKGROUND OF THE INVENTION

1. Field of the Invention

The present invention generally relates to a photodetector. More particularly, the present invention relates to a far infrared photodetector utilizing a mechanism of detection based on free carrier absorption and internal photoemission over the bandgap offset of a heterojunction.

2. Description of the Related Art

Far infrared (hereinafter "FIR") detectors are of interest for various astronomy applications such as the Stratospheric Observatory For Infrared Astronomy (SOFIA) program and Explorer missions. Stressed Ge[1] (hereinafter "[n]" referring to the nth reference in the attached list of references at the end of the specification) and blocked impurity band[2] detectors have been studied for almost 20 years as FIR detectors without being successful in making large arrays. Due to the material constraints in Ge that limit their use in arrays Si and GaAs homojunction interfacial workfunction internal photoemission infrared photodetectors (hereinafter "HIWIP") have been studied as an alternative detector structure.[3, 4] HIWIP detectors include successive highly doped emitter layers and undoped barrier layers. Detection takes place by free carrier absorption in the emitter layers followed by the internal photoemission of photoexcited carriers across the barrier and collection.[5] The cutoff wavelength is determined by the workfunction at the interface which is due to the bandgap narrowing caused by the doping in the emitter. By adjusting the device parameters, mainly the doping concentration in the emitter region, the cutoff wavelength may be tailored to the desired range.

HIWIP detectors have shown high responsivity and good detectivity in this range, but have their limitations. One is the high dark current associated with higher doping required for longer wavelength operation. Also the highest quantum efficiency reported was around 12.5% for a 20 layer structure.[6]. The workfunction in HIWIPs is due to the bandgap narrowing effect in the highly doped emitter regions. High density theory, where only the dopant type (n or p) is considered but not the specific impurities, has been used to calculate the workfunction associated with doping concentration.[5] As the concentration is increased, the doping accuracy required to achieve a consistent workfunction for detection at wavelengths beyond 200 μm becomes more stringent. In addition, the most common p-dopant, beryllium diffuses spontaneously at the concentrations required for response beyond 200 microns. The diffusion problems may be eliminated by using carbon as the dopant. However, even with the reduced diffusion, the high precision in doping density, and the uncertainty associated with the bandgap narrowing still place potential limits on the use of HIWIPs. Another issue might be the direct transitions in the p-type (heavy hole and light hole) which is favored over indirect transitions. As the doping increased, the energy gap between the two hole bands increases, reducing the associated cutoff wavelength.

Thus, there is a need to develop a new photodetector. In particular, there is a need to develop a new type of far infrared photodetectors based on a new detection mechanism, giving high quantum efficiency.

SUMMARY OF THE INVENTION

In one aspect, the present invention provides a photodetector. In one embodiment of the present invention, the photodetctor has a plurality of N barriers, N being an integer greater than 1, each barrier being a layer of a material made from a first and a second group III elements and a first group V element and characterized by a bandgap. The photodetector further has a plurality of N−1 emitters, each emitter being a layer of material made from a third group III element and a second group V element and characterized by a bandgap different from that of the barriers and having at least one free carrier responsive to optical signals, wherein each emitter is located between two barriers so as to form a heterojunction at each interface between an emitter and a barrier. Moreover, each emitter is doped with a first group II, IV or VI element to cause free carriers in the emitter, wherein at least one construction parameter of each emitter causes at least one free carrier to occupy a range of substantially continuously distributed energies characterized by a three dimensional Fermi level and respond to optical signals having wavelength in the range of 3 to 100 μm with significant absorption.

The construction parameters of each emitter are chosen from the group consisting of chemical identities of the third group III element, the first group II, IV or VI element and the second group V element, thickness of the emitter layer, doping concentration of the first group II, IV or VI element, the bandgap of the emitters, and the total number of the emitters.

In one embodiment of the present invention, the third group III element is Ga, the first group II element is Be, and the second group V element is As. Other combinations of a group III element, a group II, IV or VI element and a group V element may be utilized to practice the present invention. The thickness of each emitter layer is at least 140 Å. For example, the thickness of each emitter layer is in the range of 140 to 200 Å. The doping concentration of Be is no more than $5\times10^{18}$ cm$^{-3}$. As an example, the doping concentration of Be is in the range of $1\times10^{16}$ cm$^{-3}$ to $5\times10^{18}$ cm$^{-3}$. The bandgap of each emitter is characterized by a workfunction substantially in the range of 20 to 22 meV for each heterojunction, wherein the workfunction of each emitter is the difference between the three dimensional Fermi level of the emitter and the conduction band of a corresponding barrier. Additionally, the total number of the emitters is no smaller than 5. For example, the total number of the emitters can be chosen as an integer in the range of 5 to 50.

At least one construction parameter of each barrier causes a sharp interface between any pair of neighboring emitter and barrier and a dark current at least 100 times less than that of a comparable HIWIP at a given temperature. Likewise, the construction parameters of each barrier are chosen from the group consisting of chemical identities of the first and second group III elements and the first group V element, thickness of the barrier layer, relative concentration of the first and second group III elements, the bandgap of the barriers, and the total number of the barriers.

In one embodiment of the present invention, the first group III element is Al, the second group III element is Ga, and the first group V element is As. Other combinations of two group III elements and a group V element may be utilized to practice the present invention. The concentration of the first group III element Al is characterized by a normalized amount x, x being in the range of 0 to 1, and the concentration of the second group III element Ga is characterized by a normalized relative amount 1−x. The thickness of each barrier layer is at least 600 Å. For example, the thickness of each barrier layer can be chosen in the range of 600 to 1000 Å. The total number of the barriers is no smaller than 6. For example, the total number of the barriers is an integer in the range of 6 to 51. The density of the dark current is somewhat inversely proportional to the total number of the barrier layers, N. In other words, the dark current is higher for a lower number of barriers but it is not a direct inverse proportionality. Moreover, the bandgap offset between the emitter and barrier materials is characterized by an activation energy in the range of 18 to 20 meV. For example, the bandgap offset is characterized by an activation energy substantially in the range of 18.5 to 19.5 meV. Note that in this embodiment, the thickness of each barrier layer is greater than the thickness of each emitter layer.

Furthermore, the photodetector has a first contact layer in contact with one outmost barrier, wherein the first contact layer is made from a material substantially identical to the material from which emitters are made. The first contact layer has a first surface and an opposite second surface, and an opening defined in the first surface to receive optical signals, the second surface being in contact with one outmost barrier. The first contact layer has a high doping in order to get a good ohmic contact. This material will absorb IR so some of the first contact may be removed. The photodetector also has a second contact layer opposite the first contact layer, wherein the second contact layer is made from a material substantially identical to the material from which emitters are made. The photodetector further has a substrate in contact with the second contact layer, wherein the first contact layer is made from a material substantially identical to the material from which emitters are made. Moreover, conductive contacts located at the first and second contact layers, respectively, can be utilized for measuring the response of the photodetector to the optical signals.

In another aspect, the present invention provides a photodetector. In one embodiment of the present invention, the photodetector has a plurality of N barriers, N being an integer greater than 1, each barrier being a layer of a material made from a first and a second group III elements and a first group V element and characterized by a bandgap. The photodetector also has a plurality of N−1 emitters, each emitter being a layer of material made from a third group III element and a second group V element and characterized by a bandgap different from that of the barriers and having at least one free carrier responsive to optical signals, wherein each emitter is located between two barriers so as to form a heterojunction at each interface between an emitter and a barrier. Moreover, each emitter is doped with a first group II, IV or VI element to cause free carriers in the emitter. At least one construction parameter of each barrier causes a sharp interface between any pair of neighboring emitter and barrier and a dark current at least 100 times less than that of a comparable HIWIP at a given temperature.

The construction parameters of each barrier are chosen from the group consisting of chemical identities of the first and second group III elements and the first group V element, thickness of the barrier layer, relative concentration of the first and second group III elements, the bandgap of the barriers, and the total number of the barriers. In one embodiment of the present invention, the first group III element is Al, the second group III element is Ga, and the first group V element is As. The concentration of the first group III element Al is characterized by a normalized amount x, x being in the range of 0 to 1, and the concentration of the second group III element Ga is characterized by a normalized relative amount 1−x.

Moreover, at least one construction parameter of each emitter causes at least one free carrier to occupy a range of substantially continuously distributed energies characterized by a three dimensional Fermi level and respond to optical signals having wavelength in the range of 3 to 100 μm with significant absorption. The construction parameters of each emitter are chosen from the group consisting of chemical identities of the third group III element, the first group II, IV or VI element and the second group IV element, thickness of the emitter layer, doping concentration of the first group II, IV or VI element, the bandgap of the emitters, and the total number of the emitters. In one embodiment of the present invention, the third group III element is Ga, the first group II element is Be, and the second group V element is As.

In yet another aspect, the present invention provides a photodetector. In one embodiment of the present invention, the photodetector has at least a first and a second barriers, each barrier being a layer of a first semiconductor material, and at least one emitter, the emitter being a layer of a second semiconductor material different from the first semiconductor material and having at least one free carrier responsive to optical signals. The emitter is located between the first and second barriers so as to form a heterojunction at each interface between the emitter and the first and second barriers, and the at least one free carrier occupies a range of substantially continuously distributed energies characterized by a three dimensional Fermi level.

The first semiconductor material consists of a first and a second group III elements and a first group V element. At least one construction parameter of each barrier causes a sharp interface at each interface between the emitter and the first and second barriers and a dark current at least 100 times less than that of a comparable HIWIP at a given temperature. The construction parameters of each barrier are chosen from the group consisting of chemical identities of the first and second group III elements and the first group V element, thickness of the barrier layer, relative concentration of the first and second group III elements, and the bandgap of the barriers. In one embodiment of the present invention, the first group III element is Al, the second group III element is Ga, and the first group V element is As. The concentration of the first group III element Al is characterized by a normalized amount x, x being in the range of 0 to 1, and the concentration of the second group III element Ga is characterized by a normalized relative amount 1−x. The thickness of each barrier layer is in the range of 600 to 1000 Å. The bandgap offset between the emitter and barrier materials is characterized by an activation energy substantially in the range of 18.9 to 19.1 meV.

Moreover, the second semiconductor material consists of a third group III element and a second group V element. The emitter is doped with a first group II, IV or VI element to cause free carriers in the emitter. At least one construction parameter of the emitter causes significant absorption of optical signals having wavelength in the range of 3 to 100 µm. The construction parameters of the emitter are chosen from the group consisting of chemical identities of the third group III element, the first group II, IV or VI element and the second group V element, thickness of the emitter layer, doping concentration of the first group II, IV or VI element, and the bandgap of the emitter. In one embodiment of the present invention, the third group III element is Ga, the first group II element is Be, and the second group V element is As. The thickness of each emitter layer is in the range of 140 to 200 Å. The doping concentration of Be is in the range of $1\times10^{16}$ cm$^{-3}$ to $5\times10^{18}$ cm$^{-3}$. The bandgap of the emitter is characterized by a workfunction substantially in the range of 20 to 22 meV for the heterojunction. The thickness of each of the first and second barrier layers is greater than the thickness of the emitter layer.

The photodetector further has a first contact layer and a second contact layer, wherein the first contact layer and the second contact layer are made from a material substantially identical to the material from which the emitter is made, and the first and second barriers are located between the first contact layer and the second contact layer. The first contact layer has a first surface and an opposite second surface, and an opening defined in the first surface to receive optical signals. Conductive contacts are located at the first and second contact layers, respectively, for measuring the response of the photodetector to the optical signals.

In a further aspect, the present invention provides a method of detecting far infrared optical signals. In one embodiment of the present invention, the method includes the steps of forming a heterojunction at an interface between a layer of a first semiconductor material and a layer of a second semiconductor material different from the first semiconductor material, providing at least one free carrier responsive to the optical signals, wherein the at least one free carrier occupies a range of substantially continuously distributed energies characterized by a three dimensional Fermi level, and responding to optical signals having wavelength in the range of 3 to 100 µm with significant absorption characterized by a peak responsivity of approximately 60 A/W at a wavelength of approximately 6 µm. The method further includes the step of doping the second semiconductor material with a first group II, IV or VI element to cause free carriers in the second semiconductor material. The method also includes the step of measuring the absorption of the optical signals.

In yet another aspect, the present invention provides an apparatus for detecting far infrared optical signals. In one embodiment of the present invention, the apparatus has means for forming a heterojunction at an interface between a layer of a first semiconductor material and a layer of a second semiconductor material different from the first semiconductor material, means for providing at least one free carrier responsive to the optical signals, wherein the at least one free carrier occupies a range of substantially continuously distributed energies characterized by a three dimensional Fermi level, and means for responding to optical signals having wavelength in the range of 3 to 100 µm with significant absorption characterized by a peak responsivity of approximately 60 A/W at a wavelength of approximately 6 µm. The apparatus further has means for doping the second semiconductor material with a first group II, IV or VI element to cause free carriers in the second semiconductor material. Additionally, the apparatus has means for measuring the absorption of the optical signals.

These and other aspects will become apparent from the following description of the preferred embodiment taken in conjunction with the following drawings, although variations and modifications may be effected without departing from the spirit and scope of the novel concepts of the disclosure.

DETAILED DESCRIPTION OF THE INVENTION

Figure 1:
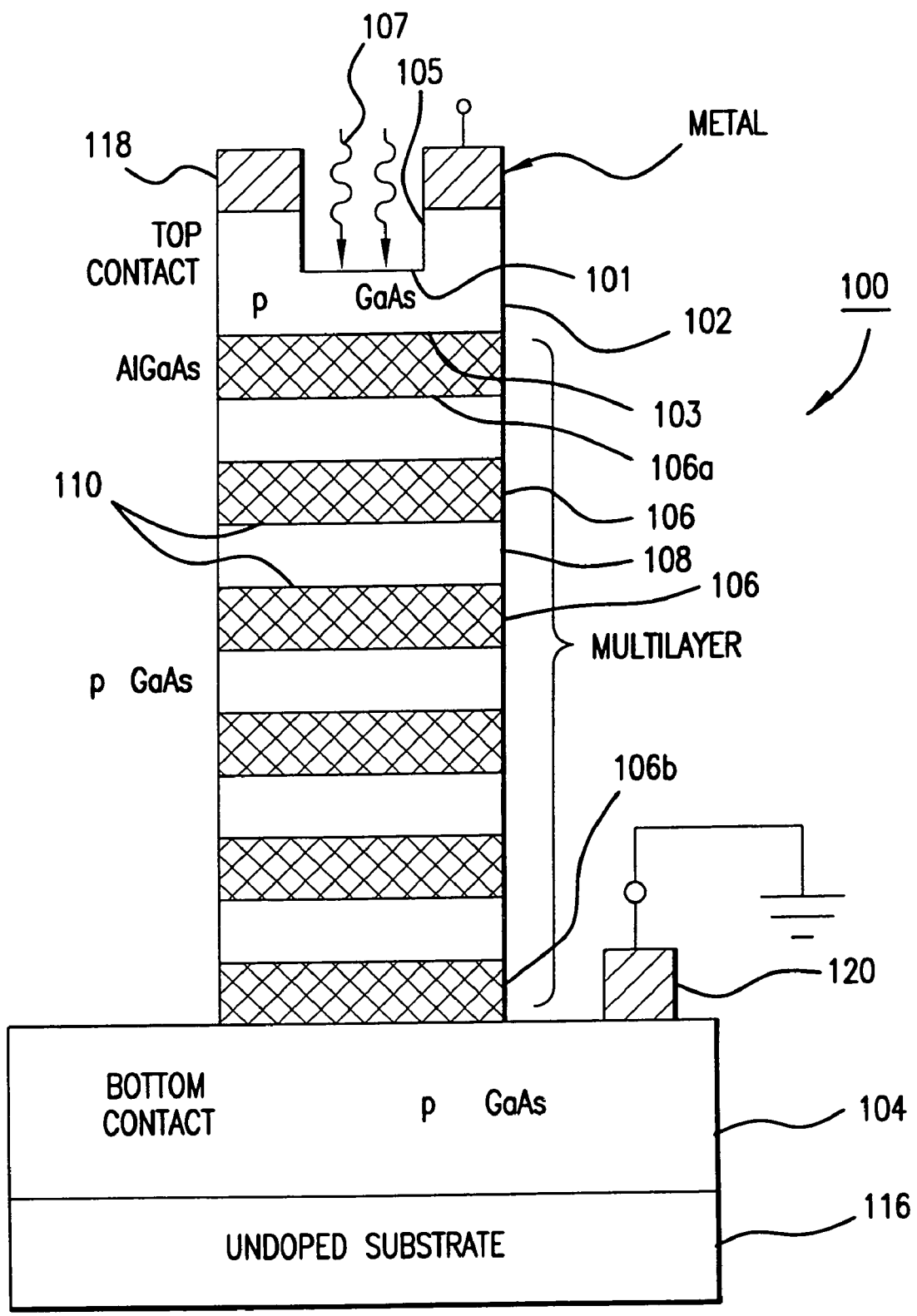
FIG. 1 is a cross-sectional view of a photodetector showing a mesa with a window etched in the top contact layer inside the metallic ring contact in one embodiment of the invention.

Several embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Additionally, as used in the description herein and throughout the claims that follow as known to people skilled in the art, a homojunction means a junction formed by two different electrical types of the same (band-gap) material. For example, a silicon p-n junction is a homojunction. A heterojunction means a junction formed by two different electrical types of two chemically different materials, each having a band-gap different from that of the other. An example of a heterojunction is a GaAs/Al(x)Ga(1−x)As junction, where x is a number satisfying 0<x<1.

Overview of the Invention

Referring generally to FIGS. 1-8 and in particular to FIG. 1 now, in one aspect, the present invention provides a photodetector 100. In one embodiment of the present invention as schematically shown in FIG. 1, the photodetctor 100 has a plurality of barriers 106. The total number of the plurality of barriers is N, where N is an integer greater than 1. For the embodiment shown in FIG. 1, N=6. Each barrier 106 is a layer of a material made from a first and a second group III elements and a first group V element and characterized by a bandgap.

Figure 2:
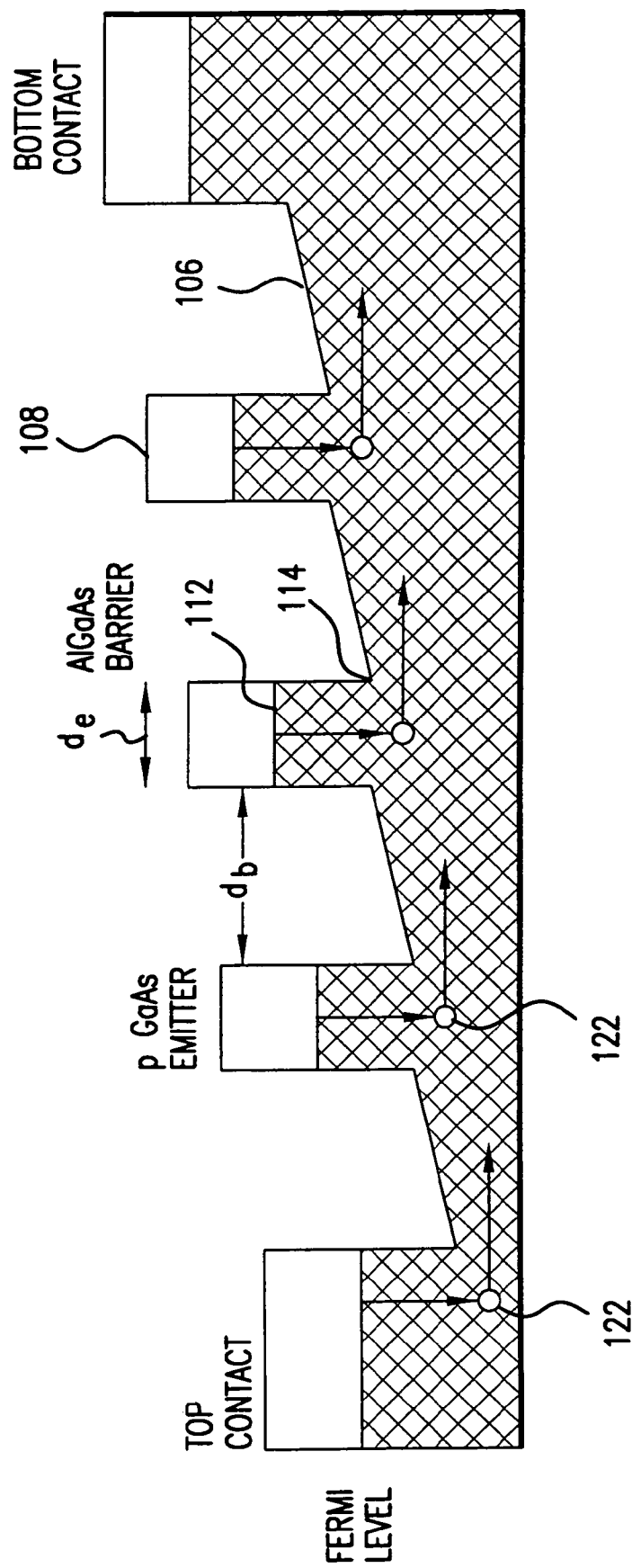
FIG. 2 illustrates a partial band diagram for the photodetector as shown in FIG. 1.

In one embodiment of the present invention, the first group III element is Al, the second group III element is Ga, and the first group V element is As. The concentration of the first group III element Al is characterized by a normalized amount x, x being in the range of 0 to 1, and the concentration of the second group III element Ga is characterized by a normalized relative amount 1−x. The thickness of each barrier layer, identified as $d_b$ in FIG. 2, is at least 600 Å. For example, the thickness of each barrier layer can be chosen in the range of 600 to 1000 Å. In Samples # 2282 and #2283, each sample being a photodetector in an embodiment of the present invention, the thickness of each barrier layer is chosen as 800 Å. The total number of the barriers 106 is no smaller than 5. For example, the total number of the barriers 106 is an integer in the range of 6 to 51. For Sample # 2282 and #2283, the total number N of the barriers 106 is chosen as 14 and 20, respectively.

The photodetector 100 further has a plurality of emitters 108. The total number of emitters is N−1. Each emitter 108 is a layer of material made from a third group III element and a second group V element and characterized by a bandgap different from that of the barriers and having at least one free carrier responsive to optical signals, wherein each emitter 108 is located between two barriers 106 so as to form a heterojunction at each interface 110 between an emitter 108 and a barrier 106. Moreover, each emitter 108 is doped with a first group II, Iv or VI element to cause free carriers in the emitter 108, wherein at least one construction parameter of each emitter 108 causes at least one free carrier to occupy a range of substantially continuously distributed energies characterized by a three dimensional Fermi level 112 as shown in FIG. 2 and respond to optical signals having wavelength in the range of 25 to 50 μm with significant absorption.

The construction parameters of each emitter 108 are chosen from the group consisting of chemical identities of the third group III elements, the first group II, IV or VI element and the second group V element, thickness of the emitter layer 108, doping concentration of the first group II, IV or VI element, the bandgap of the emitters 108, and the total number of the emitters 108.

In one embodiment of the present invention, the third group III element is Ga, the first group II element is Be, and the second group V element is As. The thickness of each emitter layer, is identified as $d_e$ in FIG. 2, is at least 140 Å. For example, the thickness of each emitter layer 108 is in the range of 140 to 200 Å. The doping concentration of Be is no more than $5 \times 10^{18}$ cm$^{-3}$. As an example, the doping concentration of Be is in the range of $1 \times 10^{16}$ cm$^{-3}$ to $5 \times 10^{18}$ cm$^{-3}$. The bandgap of each emitter 108 is characterized by a workfunction substantially in the range of 20 to 22 meV for each heterojunction. The workfunction of each emitter 108 is defined as the difference between the three dimensional Fermi level 112 of the emitter 108 and the conduction band 114 of a corresponding barrier 106 as shown in FIG. 2. Additionally, the total number of the emitters 108 is no smaller than 5. For example, the total number of the emitters 108 can be chosen as an integer in the range of 5 to 50. In FIG. 1, the total number of the emitters 108 equals to N−1=5. Note that, in another embodiment (not shown), a single emitter positioned between two barriers is workable.

At least one construction parameter of each barrier 106 causes a sharp interface 110 between any pair of neighboring emitter 108 and barrier 106 and a dark current at least 100 times less than that of a comparable HIWIP at a given temperature. Likewise, the construction parameters of each barrier 106 are chosen from the group consisting of chemical identities of the first and second group III elements and the first group V element, thickness of the barrier layer, relative concentration of the first and second group III elements, the bandgap of the barriers, and the total number of the barriers.

Figure 4:
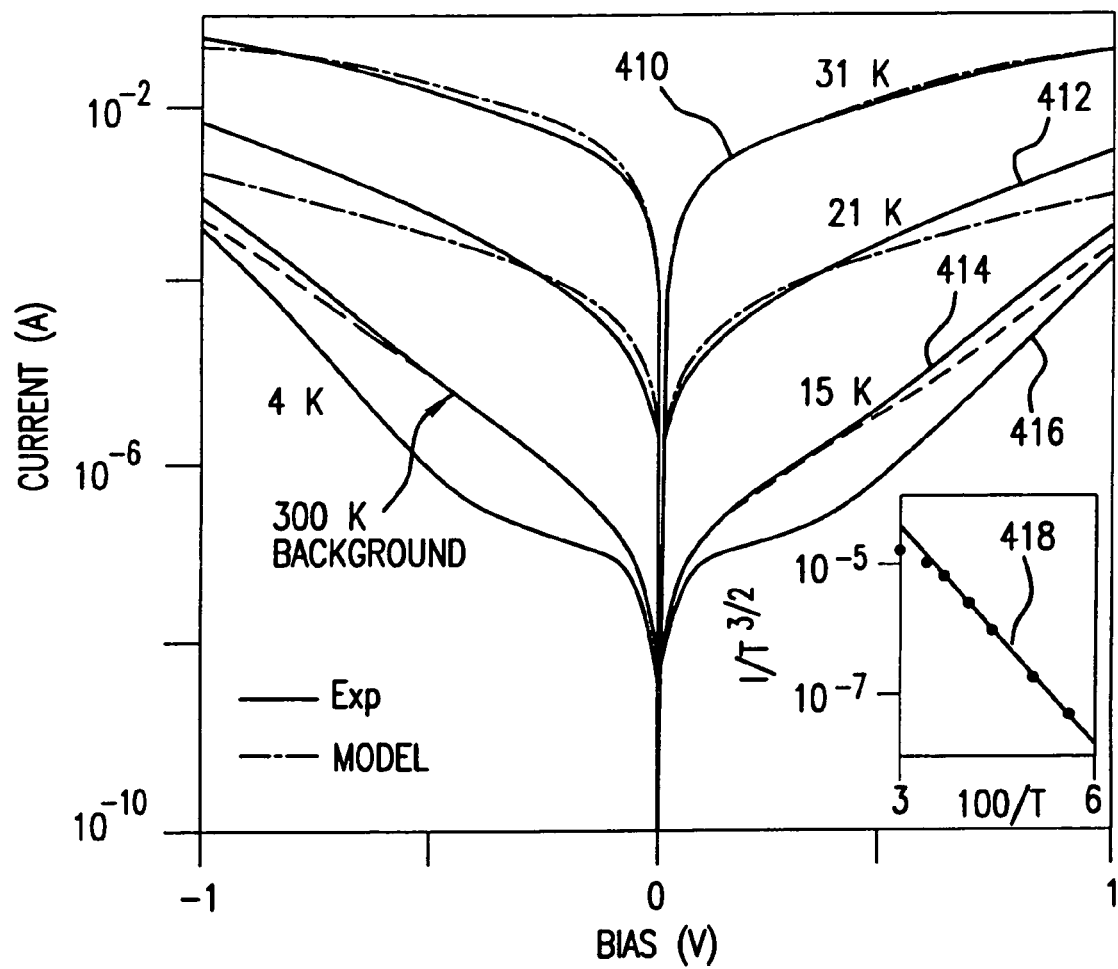
FIG. 4 illustrates dark current at various temperatures and data for related activation energy for the photodetector #2283 identified in FIG. 3.
Figure 5:
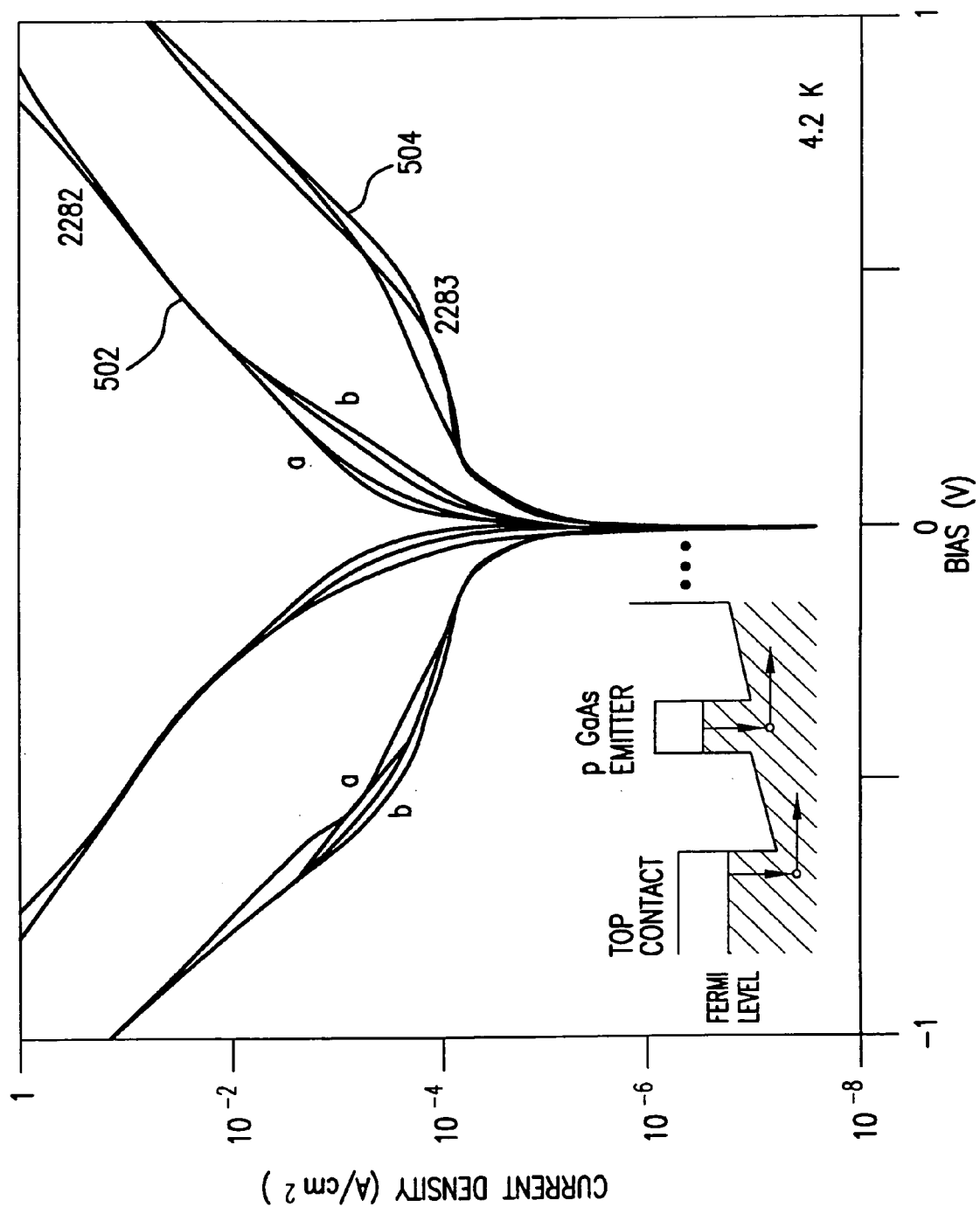
FIG. 5 illustrates dark current measurements on 4 different mesas (two mesas of 400×400 and two of 600×600 µm$^2$) for samples #2282 and #2283 showing good uniformity.

In one embodiment of the present invention, the first group III element is Al, the density of the dark current is inversely proportional to the total number of the barrier layers, N. As shown in FIG. 5, each dark current density for Sample # 2282 that has 14 layer structure (N=14) identified as curve 502, is larger than any of the dark current density for Sample # 2283 that has a 20 layer structure (N=20). Moreover, the bandgap of each barrier 106 is characterized by an activation energy in the range of 18 to 20 meV. For example, the bandgap of each barrier is characterized by an activation energy substantially in the range of 18.5 to 19.5 meV. As shown in FIG. 4, curve 418 is utilized to get an activation energy of 19±1 meV for Sample # 2283.

Note that in this embodiment, the thickness of each barrier layer $d_b$ is greater than the thickness of each emitter layer $d_e$.

Furthermore, referring now to FIG. 1, the photodetector 100 has a first contact layer 102 in contact with one outmost barrier 106a, wherein the first contact layer 102 is made from a material substantially identical to the material from which emitters 108 are made. The first contact layer 102 has a first surface 101 and an opposite second surface 103, and an opening 105 defined in the first surface 101 to receive optical signals 107, the second surface 103 being in contact with one outmost barrier 106a. The opening 105 may be formed by partially etching the first surface 101 of the first contact layer 102. The photodetector 100 also has a second contact layer 104 opposite the first contact layer 102, wherein the second contact layer 104 is made from a material substantially identical to the material from which emitters 108 are made. The photodetector 100 further has a substrate 116 in contact with the second contact layer 104, wherein substrate 116 is made from a material substantially identical to the material from which emitters 108 made but being undoped. Moreover, conductive contacts 118, 120 located at the first and second contact layers 102, 104, respectively, can be utilized for measuring the response of the photodetector 100 to the optical signals 107.

The comparison between the HEIWIP photodetector of the present invention and the photodetector of prior art can now be made. Among other things, differences between the HEIWIP and QWIP detectors lie in the difference in the width of the various layers and the detection mechanism. In QWIP detectors, the absorption takes place between states with specific energies that occur in narrow wells. The size (quantum) effects of the well determine exact energy of the states. Typical QWIP detectors have wells with thicknesses of 50 to 100 Å. This absorption mechanism has the disadvantage that the absorption probability decreases as the wavelength increases making QWIP detectors unsuitable for FIR detectors. It also means that only a narrow range of light wavelengths will be detected in a QWIP detector. In contrast, the HEIWIP photodetector of the present invention uses thicker (larger than 140 Å) emitter layers. In these thicker layers the carriers are not in states with specific energies but rather occupy a wide range of energies. The absorption mechanism (free carrier absorption) in the HEIWIP photodetector of the present invention is different from the QWIP absorption and occurs for light with a wide wavelength range without decreasing at longer wavelengths. The free carrier absorption strength increases as wavelength squared up to about 40 µm and then remains almost constant. Thus, the HEIWIP photodetector of the present invention detectors at least has an advantage in terms of response strength and the wavelength range that can be covered in a single detector over a QWIP detector.

Among other things, two of the differences between the HEIWIP photodetector of the present invention and a prior art HIWIP detector are the material in the barrier layers between the emitter layers where absorption occurs and the level of doping in the emitter layers. In a prior art HIWIP detector, the emitter and barrier layers are made of the same bandgap base material (homojunction) and the barrier is formed by the difference in allowed carrier energies in doped and undoped material. Because of the highly doped region next to the undoped region space charge develops at the interface, and along with movement of the doping material during the growth process reduces the interface sharpness leading to increased dark current and detector noise. Also in a prior art HIWIP detector, the doping concentration must be very high ($\sim 10^{19}$ cm$^{-3}$ or higher), which increases dark current further, and any variations in the doping concentration will cause variations in the barrier and hence variations in the detector response. In addition, quality of material goes down with increased doping giving rise to higher dark currents due to defects. In contrast, in the HEIWIP photodetector of the present invention, the emitter and barrier layers are made of different bandgap base materials (heterojunction) with the barrier produced by differences in allowed carrier energies for the different materials. The resulting structure has sharp interfaces between the layers of material reducing dark current ($\sim 200$ times less than for a comparable HIWIP) and detector noise. Also the doping concentration ($10^{16}$-$10^{18}$ cm$^{-3}$) of the HEIWIP photodetector of the present invention is at least an order of less than that of a prior art HIWIP detector for operating in the FIR range, which further reduces dark current.

Thus, the HEIWIP photodetector of the present invention provides the best properties of both types of prior art detectors: the improved response from the free carrier absorption mechanism of a prior art HIWIP detector with the lower dark current observed in a QWIP detector due to lower doping concentration and sharper interfaces between layers.

The invention will be better understood by reference to the following illustrative samples and corresponding testing results, which are constructed and performed according to the present invention.

Making of the New Heterojunction Photodetector and Testing Results

As discussed above, the invention in one aspect provides a far infrared detector, or more specifically, a Heterojunction Internal Workfunction Internal Photoemission (HEIWIP) far infrared detector where the workfunction is primarily due to an AlGaAs layer next to a doped GaAs (emitter) layer. As shown in FIG. 2, the emitters 108 are doped to a sufficiently high level so that the carriers 122 form a 3-dimensional distribution in the emitters 108 and detection is by free carrier absorption. The barriers 106 have a low Al fraction so that the workfunction (difference between the barrier conduction band 114 and the 3-D fermi level 112 in the emitters 108) will be small allowing operation at FIR wavelengths. By adjusting the Al fraction (and/or to a lesser extent the emitter doping density) the cutoff wavelength can be tailored to any desired wavelength. The doping in the emitters of the GaAs/AlGaAs structures in the current samples is kept low ($\leq 10^{19}$ cm$^{-3}$) to reduce the dark current to levels comparable or lower than those of QWIPs (quantum well infrared photodetectors), while the use of free carrier absorption in the emitter regions rather than the intersubband transition used in QWIPs will give the high responsivity observed in HIWIPs. Increasing the doping in the emitter region should increase the absorption in the emitters but will also increase the dark current. The optimum doping of the emitter regions will have to be determined by balancing the dark current and absorption quantum efficiency in the emitter regions. Thus, HEIWIPs can combine the best properties of the QWIP and HIWIP detectors leading to improved operation.

Figure 3:
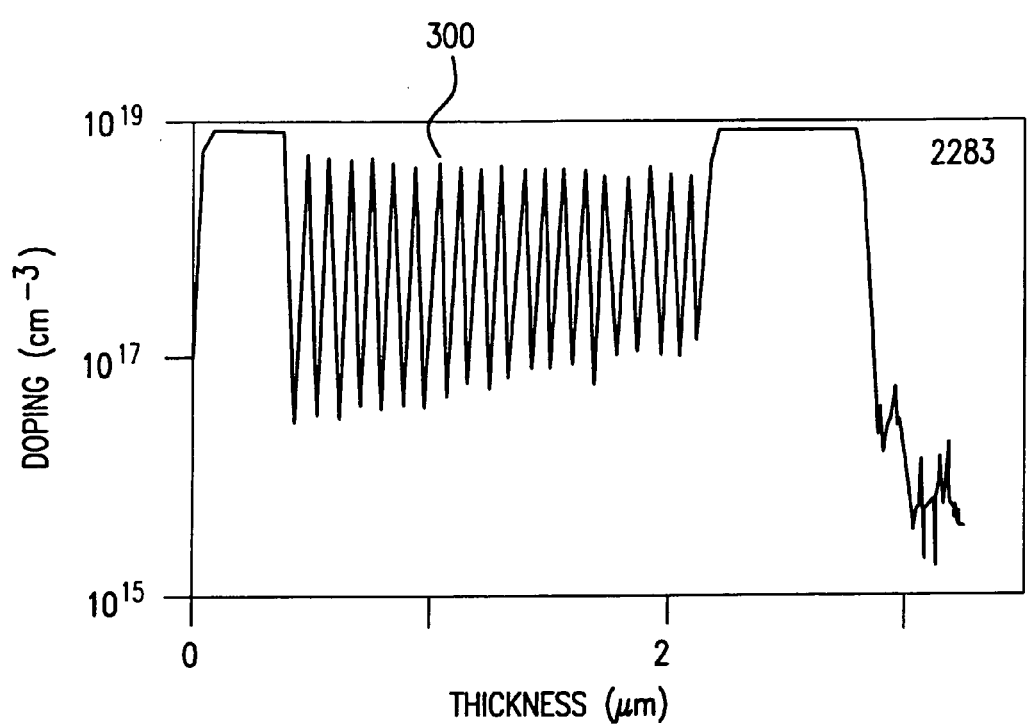
FIG. 3 shows SIMS data showing the doping concentrations and the multilayers in a sample similar to the photodetector as shown in FIG. 1 in principle, the sample photodetector being identified as Sample #2283.

The device structure (confirmed using SIMS as shown in FIG. 3) in one embodiment includes 158 Å GaAs emitters and 800 Å Al$_{0.02}$Ga$_{0.98}$As barriers. The emitters were doped with Be to $3 \times 10^{18}$ cm$^{-3}$. The top and bottom contacts were Be doped to $1 \times 10^{19}$ cm$^{-3}$ with thicknesses 0.4 µm and 0.8 µm respectively. Two samples were grown with 20 (sample #2283) and 14 (sample #2282) periods, respectively. The devices were fabricated by etching 400×400 and 600×600 µm$^2$ mesas using standard wet etching techniques and then evaporating Ti/Pt/Au ohmic contracts onto the top and bottom layers. A 260×260 µm or 460×460 µm window were opened respectively through the top contact to provide front illumination to the device.

FIG. 4 shows the dark currents 410, 412, 414 and 416 for sample #2283 at various temperatures, respectively. Also shown is the 300 K background photocurrent (as dashed line) coinciding with the 15 K dark current giving the BLIP temperature of 15 K for the detector, where BLIP (Background Limited Infrared Performance) is the operating condition where the photocurrent produced by the background radiation exceeds the dark current. Under these conditions the detector performance is limited by the background rather than the detector dark current. Above 10 K the current is primarily thermionic and an Arrhenius plot 418 (inset in FIG. 4) gives an activation energy of 19±1 meV corresponding to a cutoff wavelength ($\lambda_c$) of 65 µm. Based on the measured device parameters using SIMS data as seen in FIG. 3 the estimated work function including both the bandgap narrowing in the emitters and the AlGaAs bandgap offset was $\sim 21$ meV giving an expected $\lambda_c$ of 61 µm. The discrepancy from the predicted barrier from the Arrhenius result may be due to small variations in the doping concentration and/or in the bandgap narrowing in the emitters. Below 10 K the dark current was primarily due to tunneling and did not change with temperature with 4.2 K and 10 K curves being almost identical. The dark current at a given electric field is $\sim 200$ times less than for a HIWIP detector [7] with similar workfunction indicating the improvements in dark current provided by the present invention. The improved dark current should lead to improved specific detectivity due to associated reduction in the detector noise. FIG. 5 shows the dark current density 502, 504 for 4 mesas (of two different areas) from each sample at 4.2 K, respectively. The dark current is almost identical for the small mesas (two higher density curves labeled a in FIG. 5) from each sample indicating good uniformity. Even considering the factor of 2.25 difference in area to the other two mesas (labeled b in FIG. 5) the current densities are still very similar.

Figure 6:
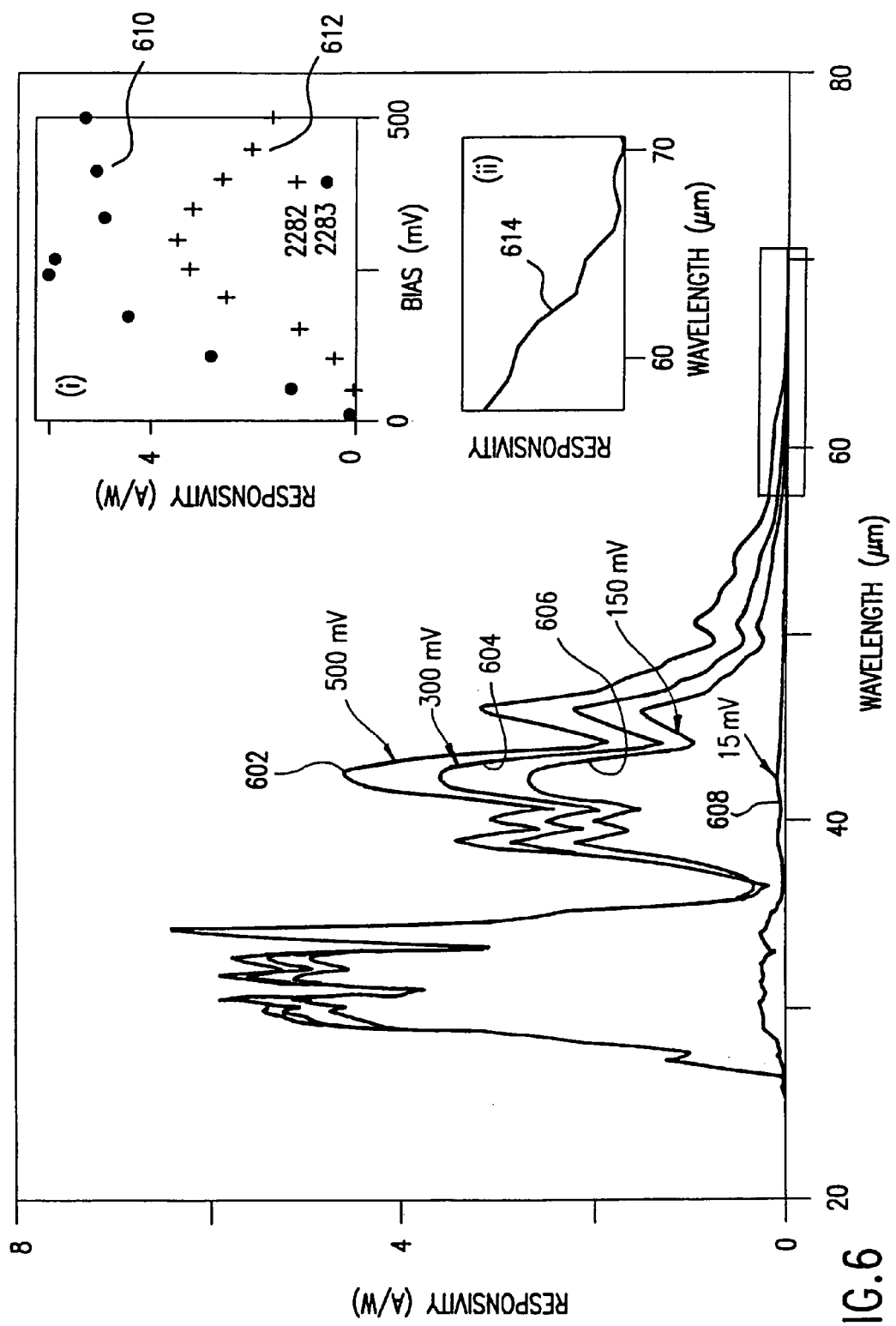
FIG. 6 shows responsivity spectra for sample #2283 at biases from 15 to 500 mV obtained at 4.2 K and the responsivity at 32.5 µm for Sample #2283 and at 25 µm for Sample #2282.

The responsivity of the detectors was measured using a Perkin-Elmer System 2000 FTIR with a Si composite bolometer as a reference detector. The results obtained for sample 2283 at various biases for 4.2 K as curves 602, 604, 606 and 608 corresponding to biases 500 mV, 300 mV, 150 mV and 15 mV, respectively, are shown in FIG. 6. The response increases with bias until a bias of $\sim 200$ mV (see inset curves 610, 612 to FIG. 6) after which it remains relatively constant. A strong response is observed for wavelengths shorter than 50 μm with $\lambda_c$ (zero response) of 70±5 μm. The peak responsivity was ~6 A/W at a wavelength of 32.5 μm. This is twice the highest responsivity obtained from HIWIP detectors[6] and an order of magnitude improvement on the 0.45 A/W obtained from QWIPs at 30 μm.[8] This confirms the expectation that the HEIWIP detectors will show the high responsivity seen in HIWIPs rather than the lower responsivity seen in QWIPs. The responsivity spectra of sample 2282 was similar to sample 2283 and the peak responsivity vs bias for both sample is also shown in inset (i) to FIG. 6. This shows that increasing the number of layers increases the responsivity as was observed for the HIWIP detectors, which could be attributed to the resonance cavity effect.[9] Spectra measured for different detector temperatures showed a decrease in responsivity between 10 and 16K which is consistent with the estimated BLIP from the photocurrent.

Noise was measured using a low-noise preamplifier (SR 560) and a fast Fourier transform (FFT) spectrum analyzer (SR780) for sample 2283 at 4.2 K. As was seen in the HIWIP detectors 1/f behavior was seen at low frequencies (<100 Hz) while at high frequencies the noise was relatively constant. For a bias of 225 mV the noise was $S_1$~$2\times10^{-30}$ $A^2/Hz$, which is much lower than the HIWIP values indicating an improvement in device quality. Based on this noise value the detectivity (denoted as D*) was ~$2\times10^{13}$ cm $Hz^{1/2}$/W which is a significant improvement over $5.9\times10^{10}$ cm $Hz^{1/2}$/W obtained for a high performance HIWIP detector.[6] NEP for the detector was $1.4\times10^{-15}$ W/$Hz^{1/2}$ again about a factor of 100 better than for the HIWIP. The photocurrent efficiency for the detector was determined by dividing the photocurrent by the number of incident photons, resulting in a peak efficiency of 23% for the HEIWIP detector, double the best HIWIP result reported to date of 12.5%[6] for a sample with the same number of layers and similar thicknesses.

Figure 7:
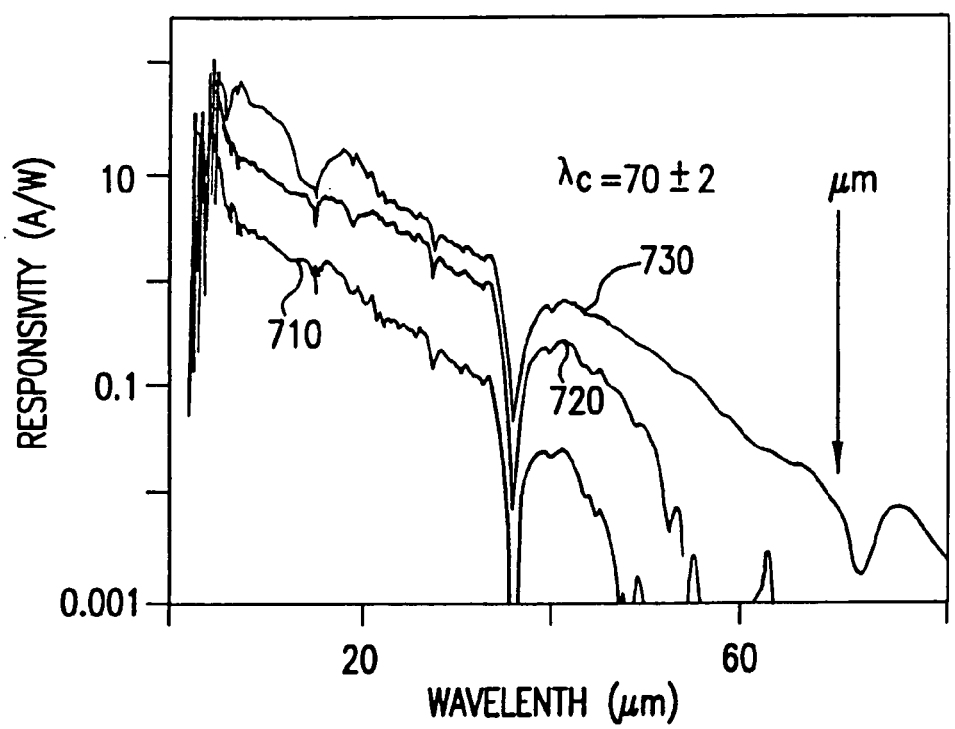
FIG. 7 shows responsivity spectra for sample #2283 at biases 0.5, 2.0 and 3.5 kV/cm (0.1, 0.4 and 0.7 curves respectively) obtained at 4.2 K. The arrow indicates the cutoff on the 3.5 kV/cm curve.
Figure 8:
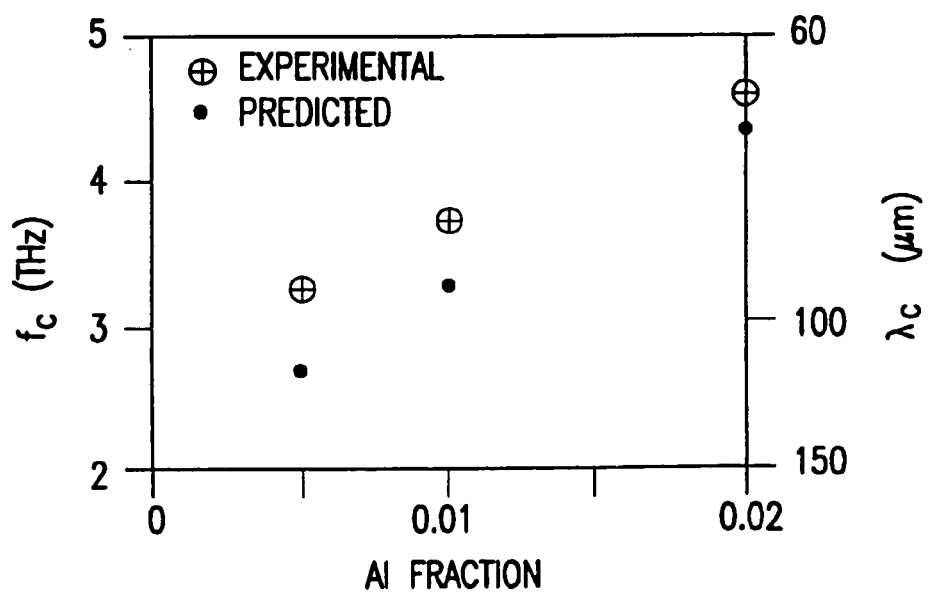
FIG. 8 illustrates the variation in cutoff frequency with Al fraction x.

FIG. 7 further shows responsivity spectra for sample #2283 at biases 0.5, 2.0 and 3.5 kV/cm (curves 710, 720 and 730 respectively) obtained at 4.2 K. The arrow indicates the cutoff on the 3.5 kV/cm curve. Note that significant responsivity can still be seen beyond 70 μm for curve 730, which has a D*~$6\times10^{13}$ cm $Hz^{1/2}$/W at a wavelength of 6 μm. For curve 730, the peak responsivity was ~60 A/W at a wavelength of 6 μm. This is twenty times the highest responsivity obtained from HIWIP detectors[6] and a two order of magnitude improvement on the 0.45 A/W obtained from QWIPs at 30 μm.[8] This again confirms the expectation that the HEIWIP detectors will show the high responsivity seen in HIWIPs rather than the lower responsivity seen in QWIPs. Moreover, FIG. 8 illustrates the variation in cutoff frequency with Al fraction x, where discrepancy between the experimental and predicted results corresponds to a variation of 1.5 meV in the barrier.

The increased D* compared to QWIPs can be understood by looking at the dark current and the absorption quantum efficiency. For the HEIWIP structure the dark current can be predicted by a 3D carrier drift model[10] given by $$j_H = 2e(\mu E)[1+(\mu E/v_{sat})^2]^{-1/2}(m_H k_B T/2\pi \hbar^2)^{3/2} \exp(-(\Delta-E\delta)/k_B T) \quad (1)$$

where μ is the mobility, E is the electric field, $v_{sat}$ is the saturated drift velocity, $m_H$ is the carrier effective mass, Δ is the activation energy, and δ is the effective interface thickness. The barrier lowering factor E δ was chosen to correspond to uniform field in the emitters and barriers. Model results for sample 2283 at 21 and 31 K using μ=80 $cm^2$/V $S^{-1}$ and Δ of 19.5 meV for forward bias and 19.0 meV for reverse bias are shown in FIG. 4 indicating a reasonable fit. The small difference in barrier height for different polarities can be due to possible variations in the Al fraction at the two ends. For a QWIP structure the dark current is given by [11]

$$j_Q = e\, k_B T\, m_Q/(\pi \hbar^2 \tau)\exp(-(\Delta-E\delta)/k_B T) \quad (2)$$

where $m_Q$ is the carrier effective mass and τ is the time for a carrier to cross the well. Since the activation energy is primarily determined by the desired $\lambda_c$ for both detectors a comparison of the dark current effectively becomes a comparison of the pre-exponential factors. The small inhomogeneous broadening effect in QWIPs with bound-to-quasi-bound transitions would add a small reduction in the dark current which will be ignored. The ratio of the dark currents in the two detectors is then $$j_H/j_Q = (2\tau \mu E)[1+(\mu E/v_{sat})^2]^{-1/2}(k_B T/2\pi \hbar^2)^{1/2} m_H^{3/2}/m_Q. \quad (3)$$

For detectors operating at 4.2 K and using a typical transit time of τ=0.5 ps and μ=80 $cm^2$/Vs$^{-1}$, $j_H/j_Q$~0.01 for a p-type HEIWIP and an n-type QWIP for fields in the operating range. The dark current for a $\lambda_c$=28 μm QWIP was already larger than the dark current observed for the $\lambda_c$=65 μm HEIWIP detectors. This confirms that the HEIWIPs can be expected to have better dark current behavior than QWIPs for far infrared operation. Although the same result should be valid for HIWIPs, the experimentally observed dark current is ~2 orders of magnitude larger than for HEIWIPs, which could be due to the material quality associated with interchanging highly doped and intrinsic regions. At long wavelengths absorption quantum efficiency strongly favors the HEIWIP structure over the QWIP structure. The free carrier absorption coefficient is α~$N_D \lambda^N$ where $N_D$ is the 3D doping density and N~2-3 for wavelengths shorter than ~30 μm and N~0 for longer wavelengths. For the QWIP α~$N_D^{2D}$ with the 2D doping density $N_D^{2D}$ being chosen so that the fermi energy is $k_B T$ to achieve the best $T_{BLIP}$. Since $T_{BLIP}$ will decrease as the desired wavelength range increases the absorption of QWIPs designed for long wavelengths will decrease. Thus both dark current and absorption favor the use of HEIWIPs over QWIPs for long wavelength detection.

Comparison of the first set of HEIWIP detectors (i.e., sample #2282 and #2283) to the current state of the art Si:As, Si:Sb and Ge:Ga detectors used in the far infrared range is also encouraging. Photocurrent quantum efficiency was 48% better than the 25% obtained for Si BIB detectors to be used in the FORCAST camera for SOFIA. [12] The responsivity and specific detectivity are also comparable to the values of 10-50 A/W for the stressed Ge:Ga detectors being developed for use in FIFI LS on SOFIA. [13] The HEIWIPs in accordance with the present invention can also lead to detectors that offer improved performance on the current state of the art.

In conclusion, results have been presented on the mechanism, structures and performance of HEIWIP detectors of the present invention. Responsivity was observed to be 60 A/W, with D*=$6\times10^{13}$ cm $Hz^{1/2}$/W, and the BLIP temperature was 15K which shows much better performance than the HIWIP detectors and comparable to state of the art Si:As, Si:Sb or Ge:Gas detectors. As was expected HEIWIPs appear to combine some of the best properties of QWIPs and HIWIPs. The dark current is lower than for QWIPs and significantly lower than for HIWIPs, while the response is higher than is observed in HIWIPs. At least because of this behavior HEIWIPs are an exciting new approach to FIR detection. Low Al fraction growth for the barriers and better determination of the fermi level in the emitter may lead to longer cutoff wavelength detectors with improved characteristics relative to the currently available detectors.

Other aspects of the invention may be found from the attached drawings and other related materials such as text in the drawings, which are an integral part of this disclosure. Moreover, other embodiments of the invention will be apparent to those skilled in the art from consideration of the specification and practice of the invention disclosed herein. Additionally, more background information can be found in the attached list of references. It is intended that the specification and examples be considered as exemplary only.

While there has been shown preferred and alternate embodiments of the present invention, it is to be understood that certain changes can be made in the form and arrangement of the elements of the system and steps of the method as would be know to one skilled in the art without departing from the underlying scope of the invention as is particularly set forth in the Claims. Furthermore, the embodiments described above are only intended to illustrate the principles of the present invention and are not intended to limit the claims to the disclosed elements.

LIST OF REFERENCES

[1] E. E. Haller, M. R. Hueschen, and P. L. Richards, Appl. Phys. Lett. 34, 495 (1979).
[2] I. C. Wu, J. W. Beeman, P. N. Luke, W. L. Hansen, and E. E. Haller, Appl. Phys. Lett. 58, 1431 (1991).
[3] A. G. U. Perera, W. Z. Shen, H. C. Liu, M. Buchanan, M. O. Tanner, and K. L. Wang, Appl. Phys. Lett. 72, 2307 (1998).
[4] W. Z. Shen, A. G. U. Perera, H. C. Liu, M. Buchanan, and W. J. Schaff, Appl. Phys. Lett. 71, 2677 (1997).
[5] A. G. U. Perera, Physics and Novel Device Applications of Semiconductor Homo Junctions, Academic Press, The Physics of Thin Films, 21, 1, 1995.
[6] A. G. U. Perera and W. Z. Shen, Opto-Electronics Review 7, 153 (1999).
[7] A. G. U. Perera, H. X. Yuan, S. K. Gamage, W. Z. Shen, M. H. Francombe, H. C. Liu, M. Buchanan, W. J. Schaff, J. Appl. Phys. 81, 3316 (1997).
[8] A. G. U. Perera, S. G. Matsik, H. C. Liu, M. Gao, M. Buchanan, W. J. Schaff and W. Yeo, Appl. Phys. Lett 77, 741 (2000).
[9] A. L. Korotkov, A. G. U. Perera, W. Z. Shen, H. C. Liu, M. Buchanan, submitted to Solid State Electronics.
[10] M. J. Kane, S. Millidge, M. T. Emeny, D. Lee, D. R. P. Guy and C. R. Whitehouse, in Intersubband transitions in Quantum Wells, E. Rosenchenr, B. Vinter and B. Levine, ed. Plenum, 1992.
[11] H. C. Liu, A. G. Steele, M. Buchanan, and Z. R. Wasilewski, J. Appl. Phys. 73, 2029 (1993).
[12] Keller et al., SPIE Proc. 4014, 86 (2000).
[13] Rosenthal et al., SPIE Proc. 4014, 156 (2000).

What is claimed is:

1. A photodetector comprising:
   a. a plurality of N barriers, N being an integer greater than 1, each barrier being a layer of a material made from a first and a second group III elements and a first group V element and characterized by a bandgap; and
   b. a plurality of N-1 emitters, each emitter being a layer of material made from a third group III element and a second group V element and characterized by a bandgap different from that of the barriers and having at least one free carrier responsive to optical signals, wherein each emitter is located between two barriers so as to form a heterojunction at each interface between an emitter and a barrier, wherein each emitter is doped with a dopant selected from the group consisting of a first group II, IV or VI element to cause free carriers in the emitter, and
   wherein at least one construction parameter of each emitter causes at least one free carrier to occupy a range of substantially continuously distributed energies characterized by a three dimensional Fermi level and respond to optical signals having wavelength in the range of 3 to 100 µm with significant absorption.

2. The photodetector of claim 1, wherein the construction parameters of each emitter are chosen from the group consisting of chemical identities of the third group III element, the first group II, IV or VI element and the second group V element, thickness of the emitter layer, doping concentration of the first group II, IV or VI element, the bandgap of the emitters, and the total number of the emitters.

3. The photodetector of claim 2, wherein the third group III element is Ga, the first group II, IV or VI element is Be, and the second group V element is As.

4. The photodetector of claim 3, wherein the thickness of each emitter layer is at least 140 Å.

5. The photodetector of claim 4, wherein the thickness of each emitter layer is in the range of 140 to 200 Å.

6. The photodetector of claim 3, wherein the doping concentration of Be is no more than $5\times10^{18}$ cm$^{-3}$.

7. The photodetector of claim 6, wherein the doping concentration of Be is in the range of $1\times10^{16}$ cm$^{-3}$ to $5\times10^{18}$ cm$^{-3}$.

8. The photodetector of claim 3, wherein the bandgap of each emitter is characterized by a workfunction substantially in the range of 20 to 22 meV for each heterojunction.

9. The photodetector of claim 8, wherein the workfunction of each emitter is the difference between the three dimensional Fermi level of the emitter and the conduction band of a corresponding barrier.

10. The photodetector of claim 3, wherein the total number of the emitters is no smaller than 5.

11. The photodetector of claim 10, wherein the total number of the emitters is an integer in the range of 5 to 50.

12. The photodetector of claim 1, wherein at least one construction parameter of each barrier causes and a dark current at least 100 times less than that of a QWIP with the same threshold wavelength at a given temperature.

13. The photodetector of claim 12, wherein the construction parameters of each barrier are chosen from the group consisting of chemical identities of the first and second group III elements and the first group V element, thickness of the barrier layer, relative concentration of the first and second group III elements, the bandgap of the barriers, and the total number of the barriers.

14. The photodetector of claim 13, wherein the first group III element is Al, the second group III element is Ga, and the first group V element is As.

15. The photodetector of claim 14, wherein the concentration of the first group III element Al is characterized by a normalized amount x, x being in the range of 0 to 1, and the concentration of the second group III element Ga is characterized by a normalized relative amount 1−x.

16. The photodetector of claim 15, wherein x equals to 0.02.

17. The photodetector of claim 13, wherein the thickness of each barrier layer is at least 600 Å.

18. The photodetector of claim 17, wherein the thickness of each barrier layer is in the range of 600 to 1000 Å.

19. The photodetector of claim 13, wherein the total number of the barriers is no smaller than 5.

20. The photodetector of claim 19, wherein the total number of the barriers is an integer in the range of 6 to 51.

21. The photodetector of claim 13, wherein the density of the dark current is inversely proportional to the total number of the barrier layers, N.

22. The photodetector of claim 13, wherein the bandgap offset between the emitter and barrier materials is characterized by an activation energy in the range of 18 to 20 meV.

23. The photodetector of claim 22, wherein the bandgap of each barrier is characterized by an activation energy substantially in the range of 18.9 to 19.1 meV.

24. The photodetector of claim 1, wherein the thickness of each barrier layer is greater than the thickness of each emitter layer.

25. The photodetector of claim 1, further comprising a first contact layer in contact with one outmost barrier, wherein the first contact layer is made from a material substantially identical to the material from which emitters are made, and wherein the first contact layer serves as an emitter.

26. The photodetector of claim 25, wherein the first contact layer has a first surface and an opposite second surface, and an opening defined in the first surface to receive optical signals, the second surface being in contact with one outmost barrier.

27. The photodetector of claim 25, further comprising a second contact layer opposite the first contact layer, wherein the second contact layer is made from a material substantially identical to the material from which emitters are made, and wherein the first contact layer serves as an emitter.

28. The photodetector of claim 27, further comprising a substrate in contact with the second contact layer, wherein the substrate is made from a material substantially identical to the material from which emitters are made.

29. The photodetector of claim 27, further comprising conductive contacts located at the first and second contact layers, respectively, for measuring the response of the photodetector to the optical signals.

30. A photodetector comprising:
    a. a plurality of N barriers, N being an integer greater than 1, each barrier being a layer of a material made from a first and a second group III elements and a first group V element and characterized by a bandgap;
    b. a plurality of N−1 emitters, each emitter being a layer of material made from a third group III element and a second group V element and characterized by a bandgap different from that of the barriers and having at least one free carrier responsive to optical signals,
    wherein each emitter is located between two barriers so as to form a heterojunction at each interface between an emitter and a barrier, wherein each emitter is doped with a dopant selected from the group consisting of a first group II, IV or VI element to cause free carriers in the emitter, and
    wherein at least one construction parameter of each barrier causes a dark current at least 100 times less than that of a QWIP with the same threshold wavelength at a given temperature.

31. The photodetector of claim 30, wherein the construction parameters of each barrier are chosen from the group consisting of chemical identities of the first and second group III elements and the first group V element, thickness of the barrier layer, relative concentration of the first and second group III elements, the bandgap of the barriers, and the total number of the barriers.

32. The photodetector of claim 31, wherein the first group III element is Al, the second group III element is Ga, and the first group V element is As.

33. The photodetector of claim 32, wherein the concentration of the first group III element Al is characterized by a normalized amount x, x being in the range of 0 to 1, and the concentration of the second group III element Ga is characterized by a normalized relative amount 1−x.

34. The photodetector of claim 30, wherein at least one construction parameter of each emitter causes at least one free carrier to occupy a range of substantially continuously distributed energies characterized by a three dimensional Fermi level and respond to optical signals having wavelength in the range of 3 to 100 μm with significant absorption.

35. The photodetector of claim 34, wherein the construction parameters of each emitter are chosen from the group consisting of chemical identities of the third group III element, the first group II, IV or VI element and the second group IV element, thickness of the emitter layer, doping concentration of the first group II, IV or VI element, the bandgap of the emitters, and the total number of the emitters.

36. The photodetector of claim 35, wherein the third group III element is Ga, the first group II, IV or VI element is Be, and the second group V element is As.

37. A photodetector comprising:
    a. at least a first and a second barriers, each barrier being a layer of a first semiconductor material; and
    b. at least one emitter, the emitter being a layer of a second semiconductor material different from the first semiconductor material and having at least one free carrier responsive to optical signals,
    wherein the emitter is located between the first and second barriers so as to form a heterojunction at each interface between the emitter and the first and second barriers, and
    wherein the at least one free carrier occupies a range of substantially continuously distributed energies characterized by a three dimensional Fermi level.

38. The photodetector of claim 37, wherein the first semiconductor material consists of a first and a second group III elements and a first group V element.

39. The photodetector of claim 38, wherein at least one construction parameter of each barrier causes a dark current at least 100 times less than that of a QWIP with the same threshold wavelength at a given temperature.

40. The photodetector of claim 39, wherein the construction parameters of each barrier are chosen from the group consisting of chemical identities of the first and second group III elements and the first group V element, thickness of the barrier layer, relative concentration of the first and second group III elements, and the bandgap of the barriers.

41. The photodetector of claim 40, wherein the first group III element is Al, the second group III element is Ga, and the first group V element is As.

42. The photodetector of claim 41, wherein the concentration of the first group III element Al is characterized by a normalized amount x, x being in the range of 0 to 1, and the concentration of the second group III element Ga is characterized by a normalized relative amount 1−x.

43. The photodetector of claim 40, wherein the thickness of each barrier layer is in the range of 600 to 1000 Å.

44. The photodetector of claim 40, wherein the bandgap offset between the emitter and barrier materials is characterized by an activation energy substantially in the range of 18.9 to 19.1 meV.

45. The photodetector of claim 37, wherein the second semiconductor material consists of a third group III element and a second group V element.

46. The photodetector of claim 45, wherein the emitter is doped with a dopant selected from the group consisting of a first group II, IV or VI element to cause free carriers in the emitter.

47. The photodetector of claim 37, wherein at least one construction parameter of the emitter causes significant absorption of optical signals having wavelength in the range of 3 to 100 µm.

48. The photodetector of claim 47, wherein the construction parameters of the emitter are chosen from the group consisting of chemical identities of the third group III element, the first group II, IV or VI element, and the second group V element, thickness of the emitter layer, doping concentration of the first group II, IV or VI element, and the bandgap of the emitter.

49. The photodetector of claim 48, wherein the third group III element is Ga, the first group II, IV or VI element is Be, and the second group V element is As.

50. The photodetector of claim 48, wherein the thickness of each emitter layer is in the range of 140 to 200 Å.

51. The photodetector of claim 48, wherein the doping concentration of Be is in the range of $1 \times 10^{16}$ cm$^{-3}$ to $5 \times 10^{18}$ cm$^{-3}$.

52. The photodetector of claim 48, wherein the bandgap of the emitter is characterized by a workfunction substantially in the range of 20 to 22 meV for the heterojunction.

53. The photodetector of claim 37, wherein the thickness of each of the first and second barrier layers is greater than the thickness of the emitter layer.

54. The photodetector of claim 37, further comprising a first contact layer and a second contact layer, wherein the first contact layer and the second contact layer are made from a material substantially identical to the material from which the emitter is made, and the first and second barriers are located between the first contact layer and the second contact layer.

55. The photodetector of claim 54, wherein the first contact layer has a first surface and an opposite second surface, and an opening defined in the first surface to receive optical signals.

56. The photodetector of claim 54, further comprising conductive contacts located at the first and second contact layers, respectively, for measuring the response of the photodetector to the optical signals.

* * * * *